US008264287B2

(12) United States Patent
Maheshwari

(10) Patent No.: US 8,264,287 B2
(45) Date of Patent: Sep. 11, 2012

(54) METHOD, APPARATUS, AND SYSTEM FOR MEASURING ANALOG VOLTAGES ON DIE

(75) Inventor: Atul Maheshwari, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 12/778,874

(22) Filed: May 12, 2010

(65) Prior Publication Data

US 2011/0279149 A1 Nov. 17, 2011

(51) Int. Cl.
*H03K 3/03* (2006.01)
(52) U.S. Cl. .................... 331/57; 331/2; 331/46
(58) Field of Classification Search ............ 327/100, 327/101, 334, 336, 339; 331/57, 2, 46
See application file for complete search history.

(56) References Cited

U.S. PATENT DOCUMENTS

| 6,429,732 B1 * | 8/2002 | Tedrow et al. ............... 327/548 |
| 2004/0032300 A1 * | 2/2004 | Joordens et al. ............... 331/57 |
| 2009/0251103 A1 * | 10/2009 | Yamamoto et al. ........... 320/133 |

OTHER PUBLICATIONS

David Jarman, "A Brief Introduction to Sigma Delta Conversion," Intersil Corporation, Application Note May 1995 AN9504, 7 pages.
"Demystifying Sigma-Delta ADCs," retrieved from http://www.maxim-ic.com/an1870 on Jan. 31, 2003, 14 pages.

* cited by examiner

*Primary Examiner* — James E Goodley
(74) *Attorney, Agent, or Firm* — Schwabe, Williamson & Wyatt, P.C.

(57) ABSTRACT

An analog-to-digital converter (ADC) suitable for measuring on-die DC or low frequency analog voltages may include a ring oscillator having a group of circuit cells successively and circularly coupled. Under certain circumstances, the ring oscillator may produce an output frequency that corresponds substantially linear to the input voltage. Other embodiments may be disclosed or claimed.

9 Claims, 6 Drawing Sheets

METHOD, APPARATUS, AND SYSTEM FOR MEASURING ANALOG VOLTAGES ON DIE

TECHNICAL FIELD

The present disclosure generally relates to integrated circuits, in particular, analog-to-digital converters for measuring on die analog voltages.

BACKGROUND

An integrated circuit, e.g., a computer chip, may often include one or more Analog-to-Digital Converters (ADCs) to measure DC and/or low frequency voltages, such as analog bias voltages, on the integrated circuit.

Traditional ADCs, such as single bit sigma-delta converters, may consume significant amount of chip area and power. Such ADCs may also require good quality passive components, including resistors, capacitors, etc., which may impose additional requirements to the fabrication process.

Some traditional ADCs may use a comparator/sweep technique to measure the external voltages, in which a comparator may be used to successively compare an external voltage with the on-die voltage. However, such ADCs may be slow due to the amount of time it takes to sweep the external voltage, even if a binary search algorithm is used. In addition, comparator off-set may often contribute to the inaccuracies.

BRIEF DESCRIPTION OF THE DRAWINGS

Embodiments of the present disclosure will be described by way of exemplary illustrations, but not limitations, shown in the accompanying drawings in which like references denote similar elements, and in which.

DETAILED DESCRIPTION OF ILLUSTRATIVE EMBODIMENTS

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The description may use various terms such as "gate," "transistor," "resistor," "counter," "PMOS" and "NMOS" etc. to represent various components used in various embodiments. It is understood that these components may be implemented in various ways and/or be replaced by components of similar functionality. For example, a "resistor" may be implemented with a plurality of resistors or transistors. Similarly, a "counter" may be implemented by a variety of transistors and logic gates. Therefore, the terms used throughout this disclosure are for purpose of illustration only, not to be construed as limitations.

Figure 1:
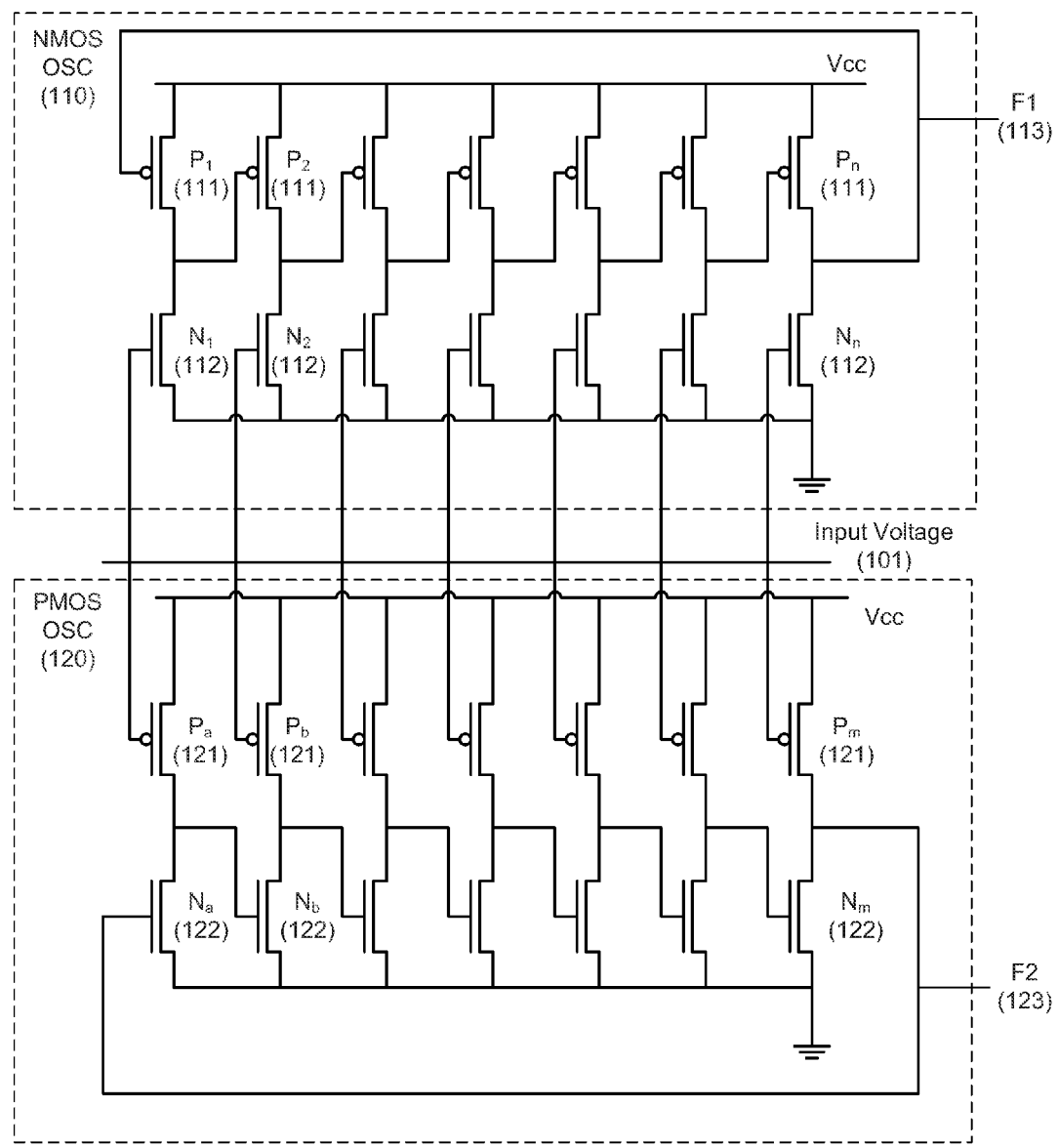
FIG. 1 is a block diagram of an example ADC in accordance with various embodiments.

FIG. 1 is a block diagram of an example ADC in accordance with various embodiments of the present disclosure. For the illustrated embodiments, an ADC 100 may include two ring oscillators, an NMOS based ring oscillator 110 and a PMOS based ring oscillator 120, as illustrated by the two areas surrounded by the dashed lines. Both ring oscillators 110 and 120 may be coupled to an input voltage 101. The NMOS based ring oscillator 110 may generate an output frequency 113 based on the input voltage 101, and the PMOS based ring oscillator 120 may generate an output frequency 123 also based on the input voltage 101. Further details on how the output frequencies 113 and 123 may be converted to a digital symbol representing the input voltage 101 will be provided in later sections of this disclosure.

In various embodiments, The NMOS based ring oscillator 110 may include a group of odd numbered circuit cells successively and circularly coupled in multiple stages. Each circuit cell of the ring oscillator 110 may include two components, a pull-up transistor 111 and a pull-down transistor 112. The pull-up transistor 111 may be a PMOS transistor, and the pull-down transistor 112 may be an NMOS transistor. As illustrated in FIG. 1, the NMOS based ring oscillator 110 may include n stages of circuit cells, where n may be an odd-numbered integer, with the pull-up transistors 111 of the various stages of circuit cells identified as $P_1, P_2, \ldots P_n$, and the pull-down transistors 112 of the various stages of circuit cells identified as $N_1, N_2, \ldots N_n$. The source terminals of the pull-up transistors 111 may be coupled to Vcc. The source terminals of the pull-down transistors 112 may be coupled to the ground. The drain terminal of the pull-up transistor 111 and the drain terminal of the corresponding pull-down transistor 112 of each circuit cell may be serially coupled. In addition, the drain terminals of the pull-up transistors 111 and the corresponding pull-down transistors 112 of a particular circuit cell may be further coupled to the gate terminal of the pull-up transistor 111 of the immediate next stage of the circuit cell. The drain terminals of the pull-up transistors $P_n$ and the pull-down transistor $N_n$ of the last circuit cell in the series may be coupled to the gate terminal of the pull-up transistor $P_1$ of the first circuit cell of the series, thereby forming an oscillator ring.

In various embodiments, the pull-up transistor 111 of a particular circuit cell of the NMOS based ring oscillator 110 may be structurally bigger in size than the corresponding pull-down transistor 112 of that particular circuit cell. For example, the width of the pull-up transistors may be 6.5μ, and the width of the pull-down transistors 112 may only be 0.5μ. The difference in physical dimensions of the pull-up and the pull-down transistors may impact how fast the pull-up and pull-down transistors switch current, i.e., current may flow between the source terminal and the drain terminal of the pull-up/pull-down transistor. In particular, where the pull-down transistor 112 is smaller than the pull-up transistor 111, the pull-down transistor 112 may be slower in switching the current. Therefore, most of the transistor gate delay of each stage of the NMOS based ring oscillator 110 may be attributable to the pull-down transistors 112. The exact transistor gate delay of the pull-down transistors 112 may also depend on the input voltage 101. Therefore, the output frequency 113 may correlate to the input voltage 101. Further details of the correlation between the input voltage 101 and the output frequency 113 will be provided in later sections of this disclosure.

In various embodiments, the pull-up transistors 111 of the various stages of the NMOS based oscillator 110 may or may not have the same physical size or structure. Similarly, the pull-down transistors 112 of the various stages of the NMOS based oscillator 110 may or may not have the same physical size or structure.

In various embodiments, the PMOS based ring oscillator 120 may be similarly constructed in a complementary fashion. The PMOS based ring oscillator 120 may comprise m stages of circuit cells successively and circularly coupled in a series, where m may be an odd-numbered integer. In various embodiments, m may equal to n. The input voltage 101 may be coupled to the gate terminals of the pull-up transistor 121 of each circuit cell of the PMOS based ring oscillator 120. The drain terminals of the pull-up transistor 121 and the pull-down transistor 122 of a particular circuit cell of the PMOS based ring oscillator 120 may be coupled to the gate terminal of the pull-down transistor 122 of the immediate next stage of the circuit cell of the PMOS based ring oscillator 120. And the drain terminals of the pull-up transistor $P_m$ and pull-down transistor $N_m$ of the last stage of the circuit cells may be coupled to the gate terminal of the pull-down transistor $N_a$ of the first stage of the circuit cells of the PMOS based ring oscillator 120. The pull-down transistor 122 of a particular circuit cell may be structurally bigger in size than the corresponding pull-up transistor 121 of that circuit cell. Accordingly, most of the staged transistor gate delays of the PMOS based ring oscillator 120 may be attributable to the pull-up transistors 121, and the output frequency 123 may correlate to the input voltage 101.

In various embodiments, the pull-up transistors 111 and 121 may be PMOS transistors, or P-type transistors, and the pull-down transistor 112 and 122 may be NMOS transistors, or N-type transistors.

FIG. 1 illustrates both the NMOS based ring oscillator 110 and the PMOS based ring oscillator 120 having seven stages. In various embodiments, more or less number of stages may be used in the ring oscillators 110 and 120, so long as oscillation is induced. Furthermore, the number of stages for the NMOS based ring oscillator 110 (n) and the number of stages for the PMOS based ring oscillator 120 (m) may or may not be the same. Further details of the optimum number of stages for the ring oscillators 110 and 120 will be provided in later sections of this disclosure.

Even though FIG. 1 illustrates an ADC having both a NMOS based ring oscillator 110 and a PMOS based ring oscillator 120, in various embodiments, under certain circumstances, an ADC having a single NMOS or PMOS based ring oscillator may be sufficient, as will be explained in later sections of this disclosure.

Figure 2:
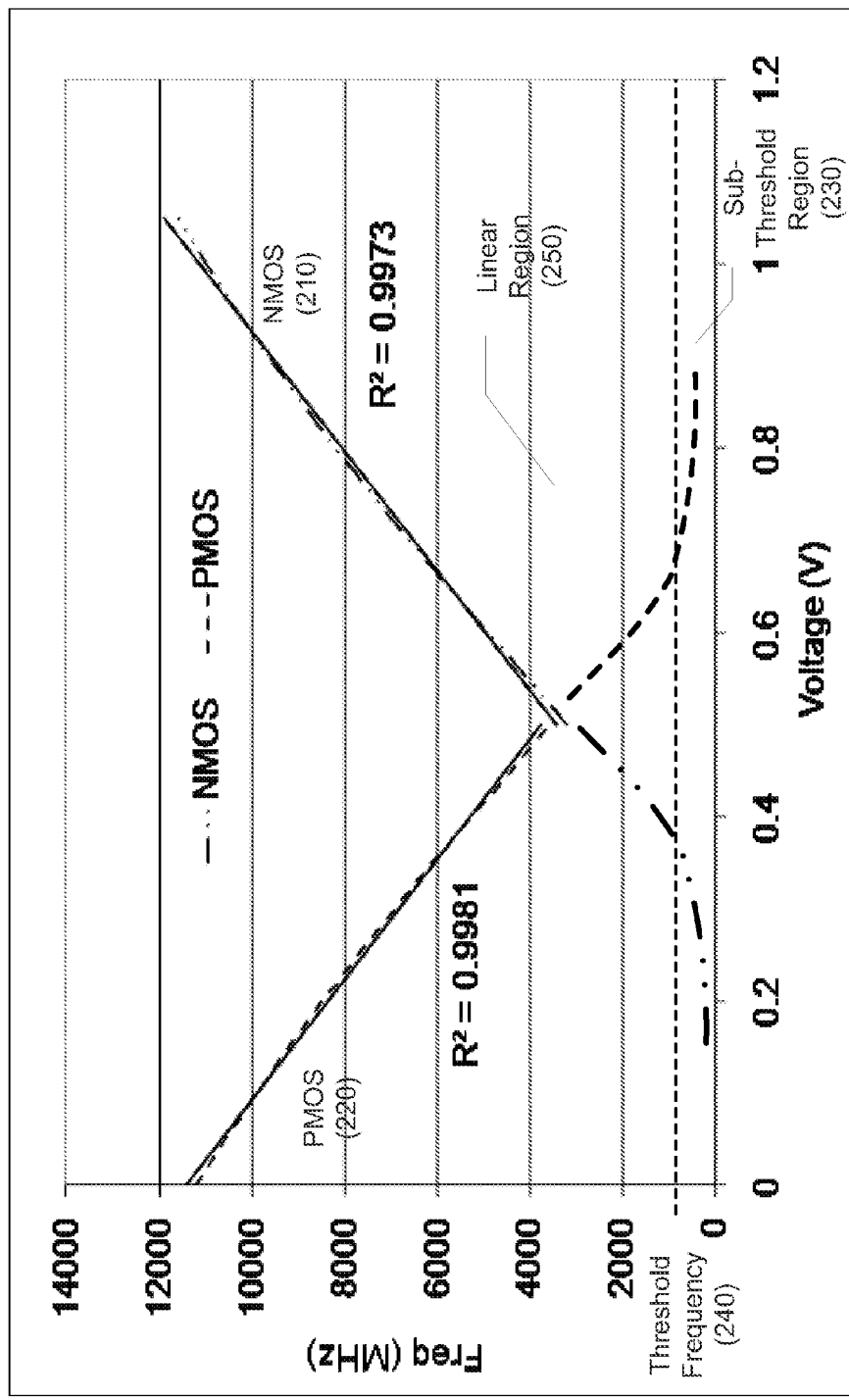
FIG. 2 is a chart diagram illustrating the correlation between the input voltage and the output frequencies of the ADC, in accordance with various embodiments.

In various embodiments, the output frequencies 113 and 123 may correlate to the input voltage 101. Furthermore, under certain circumstances, the output frequencies 113 and 123 may substantially linearly correspond to the input voltage 101. FIG. 2 is a chart diagram illustrating the correlation between the input voltage 101 and the output frequencies 110 and 120 of the ADC, in accordance with various embodiments. The horizontal axis may represent the voltage and the vertical axis may represent the frequency. The relationship between the output frequency 113 of the NMOS based ring oscillator 110 v. the input voltage 101 may be represented by the dashed and double-dotted line 210. The relationship between the output frequency 123 of the PMOS based ring oscillator 120 v. the input voltage 101 may be represented by the dashed line 220. In FIG. 2, the symbol $R^2$ may refer to the linear regression of the output frequencies 113 and 123. $R^2$ may be a number from 0 to 1. Linear regression value $R^2$ of 1 may indicate a perfect line. And the closer $R^2$ may be to 1, the straighter the line.

In various embodiments, as illustrated in FIG. 2, when the input voltage 101 is between about 0.3*Vcc to Vcc, the output frequency 113 of the NMOS based ring oscillator 110 may substantially linearly correspond to the input voltage 101, as indicated by a linear regression value $R^2$ of 0.9973. Accordingly, in various embodiments, when the input voltage 101 is around 0.3*Vcc, the output frequency 113 of the NMOS based ring oscillator 110 may be referred to as a threshold frequency 240. When the input voltage 101 is between about 0.3*Vcc to Vcc, the output frequency 113 of the NMOS based ring oscillator 110 may be referred to as a linear region 250 of the NMOS based ring oscillator 110, illustrated in FIG. 2 as the area above the threshold frequency 240. When the input voltage 101 is between 0 to 0.3*Vcc, the output frequency 113 of the NMOS based ring oscillator 110 may be referred to as a sub-threshold region 230 of the NMOS based ring oscillator 110, illustrated in FIG. 2 as the area below the threshold frequency 240. Within the sub-threshold region 230, the output frequency 113 may be below the threshold frequency 240 and may not be substantially linear to the input voltage 101.

Likewise, when the input voltage 101 is between 0 to 0.7*Vcc, the output frequency 123 of the PMOS based ring oscillator 120 may substantially linearly correspond to the input voltage 101, as indicated by a linear regression value $R^2$ of 0.9981. Therefore, the output frequency 123 within this region may be referred to as the linear region 250 of the PMOS based ring oscillator 120. When the input voltage 101 is between 0.7*Vcc and Vcc, the output frequency 123 of the PMOS based ring oscillator 120 may be referred to as the sub-threshold region 230 of the PMOS based ring oscillator 120. Within the sub-threshold region 230, the output frequency 123 may be below the threshold frequency 240 and may not be substantially linear to the input voltage 101.

In various embodiments, the linear regression value R^2 of the output frequency 113 within the linear region 250 may depend on the specific parameters of the NMOS based ring oscillator 110, such as the physical dimensions of the pull-down transistor 112 and pull-up transistor 111. A relatively big pull-up transistor 111 and a relatively small pull-down transistor 112 may yield a high linear regression value R^2 for the NMOS based ring oscillator 110 within the linear region 250. Similarly, a relatively big pull-down transistor 122 and a relatively small pull-up transistor 121 may yield a high linear regression value R^2 for the PMOS based ring oscillator 120 within the linear region 250. In various embodiments, the linear region 250 for the NMOS based ring oscillator 110 may start higher or lower than 0.3*Vcc. Similarly, the linear region 250 for the PMOS based ring oscillator 120 may start higher or lower than 0.7*Vcc.

In various embodiments, within the linear region 250, the slope of the output frequency 210 v. the input voltage 101 for the NMOS based ring oscillator 110 may depend on specific parameters of the NMOS based ring oscillator 110, such as the physical dimensions of the pull-down transistor 112 and pull-up transistor 111, and the number of stages the NMOS based ring oscillator 110 may have. For a given input voltage 101, the longer the transistor gate delay of the pull-down transistor 112 and the higher the number of stages of the NMOS based ring oscillator 110, the lower may be the output frequency 210. Too many stages may increase the chip area and power consumption of the ADC. Too few stages may prevent the ADC 100 from oscillating for lack of transistor gate delays, or cause the ADC 100 to oscillate at a very high frequency, which may impose higher requirements to other parts of the ADC 100, such as counters, to accurately convert the output frequency 210 to the digital symbol representing the input voltage 101. The optimum parameters for the physical dimensions of the pull-down transistors 112, the pull-up transistors 111, and the exact number of stages of the NMOS based ring oscillator 110 may be application dependent and/or fine tuned during product testing. For example, a NMOS based ring oscillator 110 between 5 and 7 stages may be optimum in some circumstances. In various embodiments, more or less number of stages may be used. The optimum parameters of the PMOS based ring oscillator 120 may be similarly tuned and configured.

FIG. 2 only shows a single threshold frequency 240 and an overlapping linear region 250 and sub-threshold region 230 for both ring oscillators 110 and 120 for simplicity and clarity. In various embodiments, the NMOS based ring oscillator 110 and the PMOS based ring oscillator 120 may have different threshold frequencies, and non-overlapping linear or sub-threshold regions.

As illustrated in FIG. 2, if the value of the input voltage is already known to be within the linear region 250 of either the NMOS or PMOS based ring oscillator, an ADC having a single NMOS or PMOS based ring oscillator may be sufficient. This may reduce the complexity of the ADC.

Figure 3:
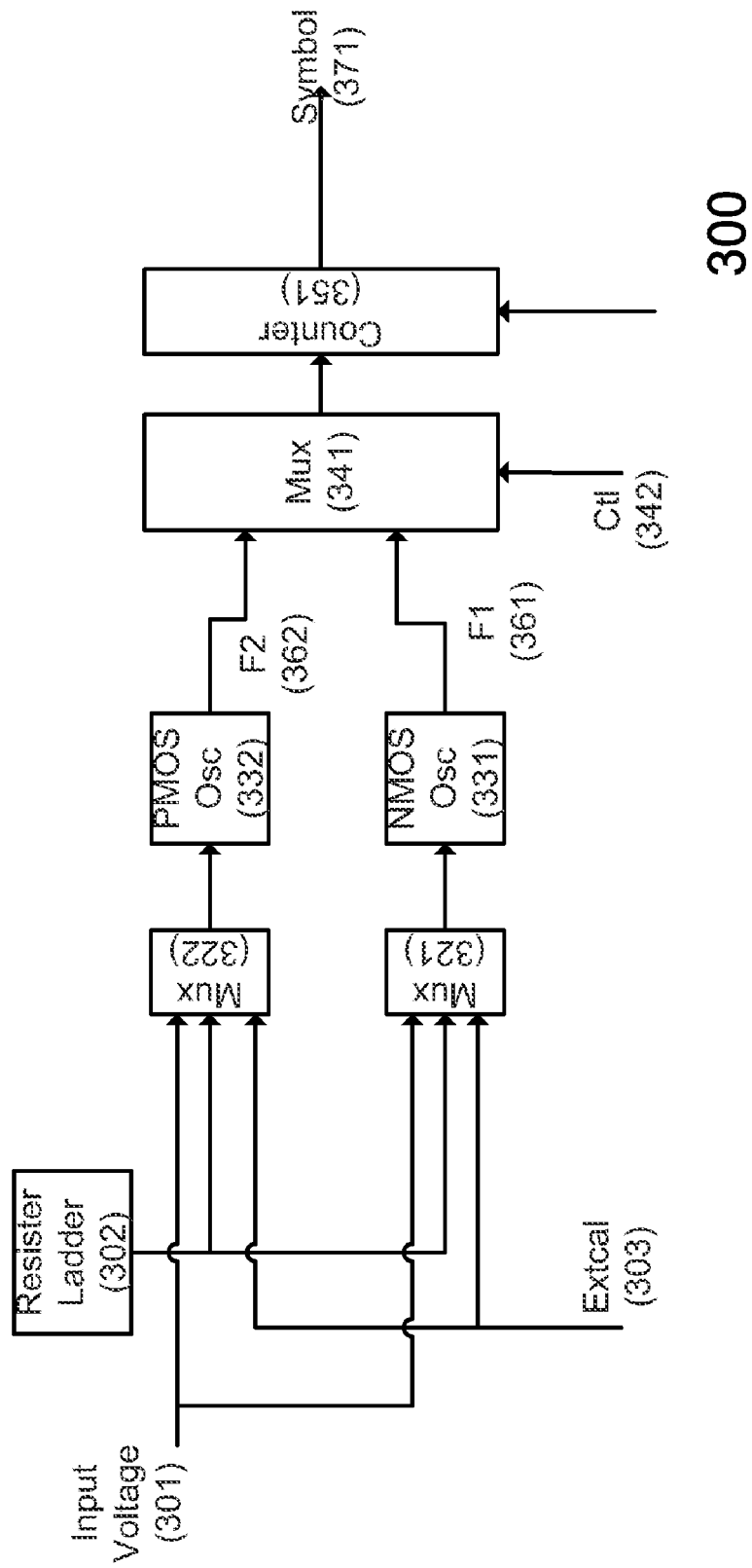
FIG. 3 is a block diagram of an example ADC with additional components in accordance with various embodiments.

FIG. 3 is a block diagram of an example ADC 300 with additional components in accordance with various embodiments. In various embodiments, as illustrated, an ADC 300 may include an input voltage 301, an NMOS based ring oscillator 331, a PMOS based ring oscillator 332, a multiplexer 341, and a counter 351, coupled with each other as shown. The NMOS based ring oscillator 331 and the PMOS based ring oscillator 332 may be similar to the ring oscillators 110 and 120 as illustrated in FIG. 1. The ring oscillators 331 and 332 may be coupled to the multiplexer 341. The multiplexer 341 may selectively provide either an output frequency 361 from the NMOS based ring oscillator 331 or an output frequency 362 from the PMOS based ring oscillator 332 to the counter 351. The counter 351 may generate a digital symbol 371 that represents the input voltage 301.

In various embodiments, the multiplexer 341 may select either the output frequency 361 or the output frequency 362 and provide the selected output frequency to the counter 351 based on a control signal 342. The control signal 342 may be generated by a control unit not shown in FIG. 3. The control signal 342 may indicate to the multiplexer 341 to select the output frequency 361 if the output frequency 361 is above the threshold frequency of the NMOS based ring oscillator 331 and/or the output frequency 362 is below the threshold frequency of the PMOS based ring oscillator 332. Alternatively, the control signal 342 may indicate to the multiplexer 341 to select the output frequency 362 if the output frequency 361 is below the threshold frequency of the NMOS based ring oscillator 331 and/or the output frequency 362 is above the threshold frequency of the PMOS based ring oscillator 332.

In various embodiments, both output frequencies 361 and 362 may be above the respective threshold frequencies of the NMOS based ring oscillator 331 and PMOS based ring oscillator 332. This may occur if there is an overlapping linear region 250 for the NMOS based ring oscillator 331 and the PMOS based ring oscillator 332 as illustrated in FIG. 2. The control unit may generate the control signal 342 to indicate to the multiplexer 341 to select either the output frequency 361 or the output frequency 362, as both outputs are within the respective linear region of the ring oscillators 331 and 332. In other embodiments, the control unit may generate the control signal 342 to indicate to the multiplexer 341 to select first the output frequency 361 and then the output frequency 362, and the counter 351 may include additional components not shown in FIG. 3 to generate the digital symbol 371 based on an average outcome of the two output frequencies.

In various embodiments, the counter 351 may generate the digital symbol 371 based on the selected output frequency. The digital symbol 371 may be a binary word that represents the value of the input voltage 301. The counter 351 may generate the digital symbol 371 based on a transfer function that converts the selected output frequency to the input voltage as long as the selected output frequency is within the linear region 250 as illustrated in FIG. 2.

In various embodiments, the threshold frequency 240, and the transfer function applied by the counter 351 may be obtained or further optimized through a calibration process. Calibration may, in general, be performed by a repeated sequence of feeding an input voltage of a known value to the ADC 300 and compare the output frequencies 361 and 362 with expected output frequencies under the input voltage. Further details of the calibration process will be provided in later sections of this disclosure.

In further embodiments, the ADC 300 may include an optional digital-to-analog converter (DAC) 302 to generate one or more calibration input voltages with known values. In various embodiments, DAC 302 may be a resistor ladder based DAC. Multiplexers 321 and 322 may enable the input voltage 301 and the DAC 302 to share the same input path to the NMOS based ring oscillator 331 and the PMOS based ring oscillator 332, respectively.

In still further embodiments, the multiplexers 321 and 322 may each include an optional input terminal that may accept an external calibration input voltage 303. The multiplexers 321 and 322 may enable the input voltage 301 and the external calibration input voltage 303 to share the same input path to the NMOS based ring oscillator 331 and the PMOS based ring oscillator 332, respectively.

Even though FIG. 3 illustrates both the DAC 302 and the external calibration input voltage 303, in various embodiments, the ADC 300 may include only the DAC 302, only the external calibration input voltage 303, both the DAC 302 and the external calibration input voltage 303, or neither.

Figure 4:
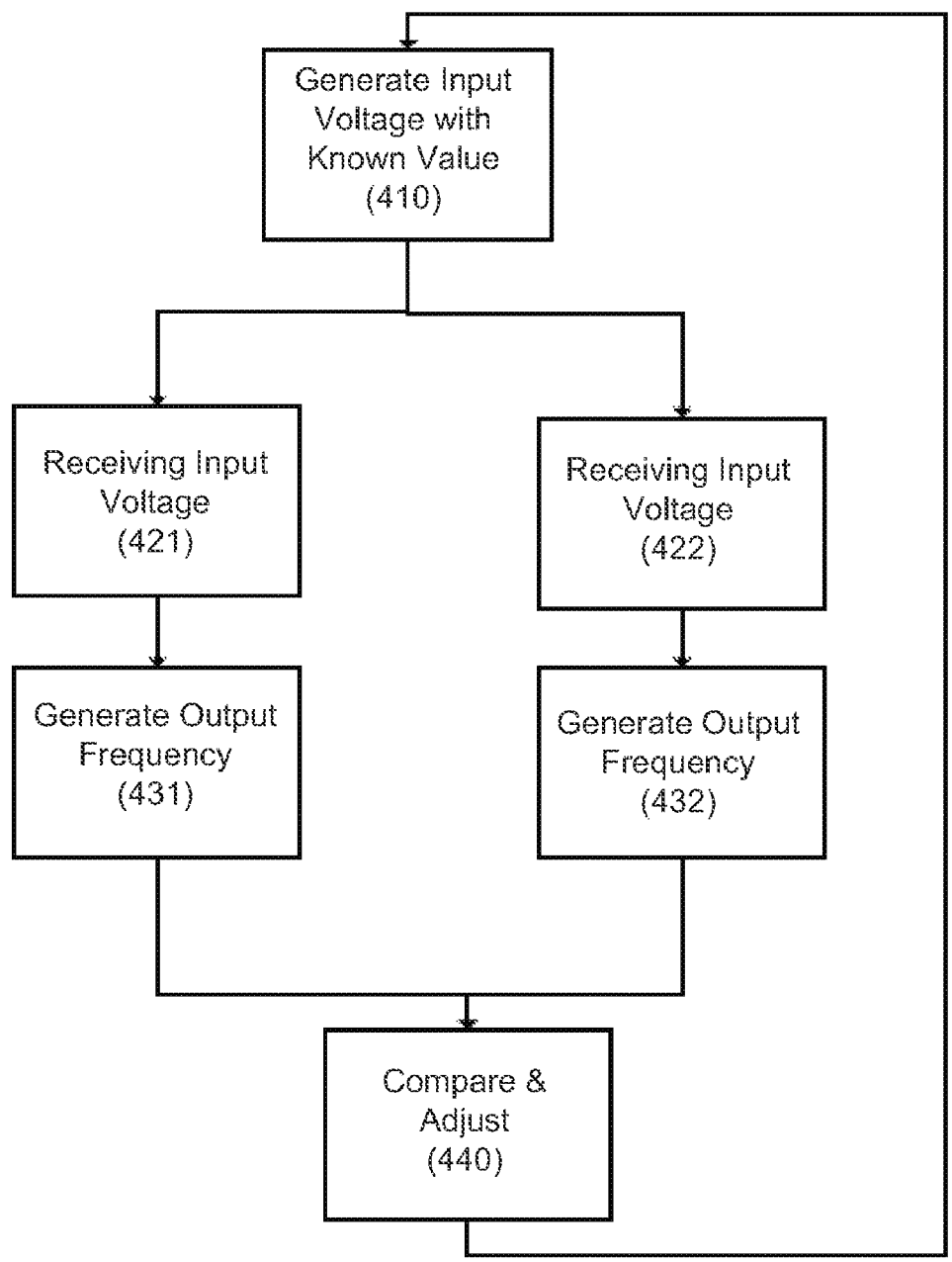
FIG. 4 is a flow diagram illustrating a portion of an example calibration operation of the ADC in accordance with various embodiments.

FIG. 4 is a flow diagram illustrating a portion of an example calibration operation of the ADC 300 in accordance with various embodiments. In various embodiments, an input voltage of a known value may be generated by an external voltage source or an on-die DAC, e.g., a resistor ladder, in block 410. The input voltage may be provided to the NMOS based ring oscillator 331 in block 421, and to the PMOS based ring oscillator 332 in block 422. The NMOS based ring oscillator 331 may generate the output frequency 361 in block 431, and the PMOS based ring oscillator 332 may generate the output frequency 362 in block 432. A calibration unit (not shown in FIG. 3) may then compare the output frequency 361 with an expected output frequency of the NMOS based ring oscillator 331, and compare the output frequency 362 with an expected output frequency of the PMOS based ring oscillator 332. The calibration unit may then adjust various components, including the multiplexer 341 and the counter 351, in accordance with the results of the comparisons previously obtained in block 440. The entire process may then be repeated for a number of times to fine tune the accuracy of the ADC 300. The accuracy of the ADC 300 may depend on various parameters of the ADC 300, such as physical dimension of the device, how long the counter 351 has been in use, etc. In various embodiments, a two-point calibration process may bring the accuracy of the ADC 300 to within 0.1 mV of the input voltage.

Figure 5:
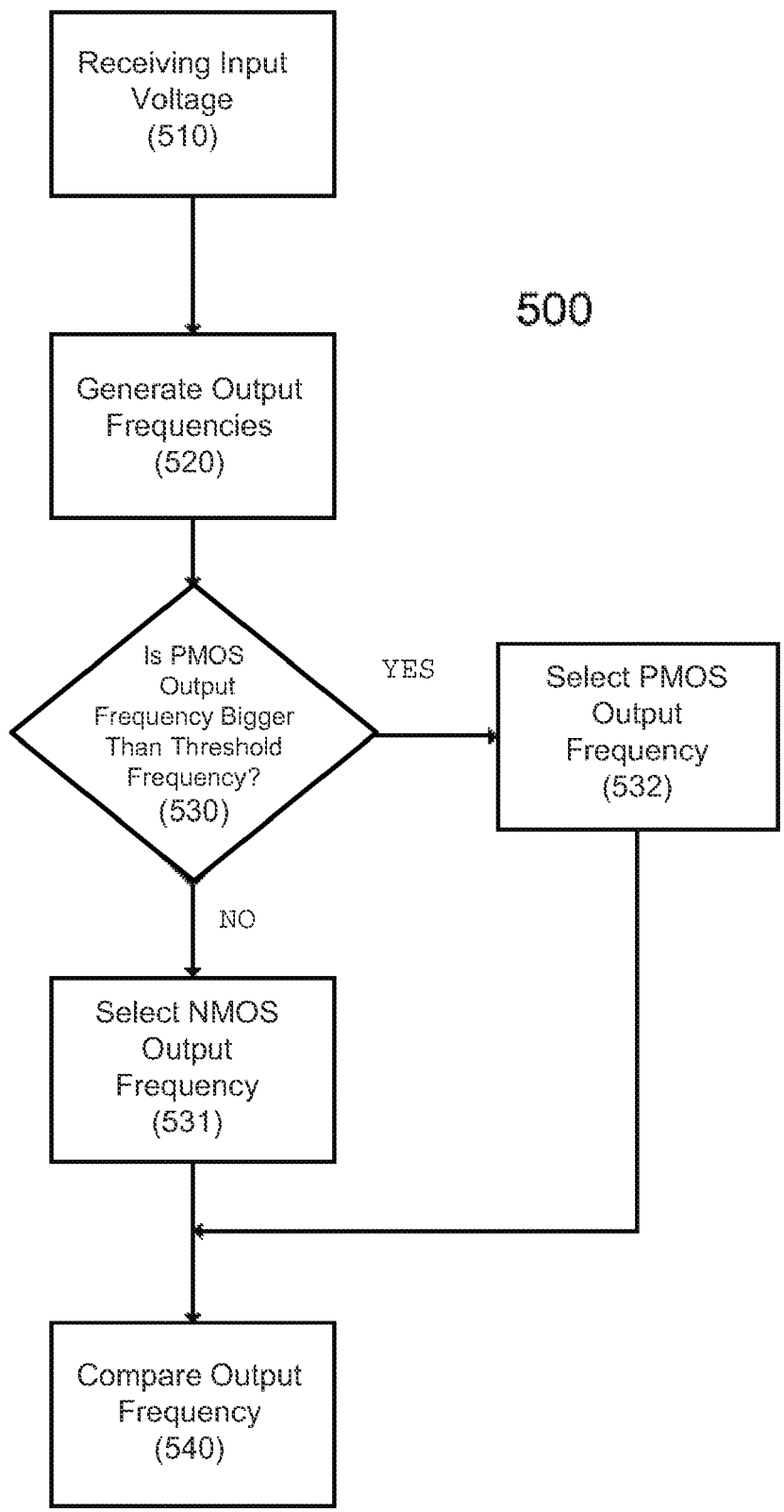
FIG. 5 is a flow diagram illustrating a portion of an example operation of the ADC in accordance with various embodiments.

FIG. 5 is a flow diagram illustrating a portion of an example operation of the ADC 300 in accordance with various embodiments. The ADC 300 may receive an input voltage 301 in block 510. The input voltage may be a DC voltage or a low frequency analog voltage on a die of an integrated chip in which the ADC may reside. In various embodiments, the low frequency analog voltage may be a voltage signal having a frequency within the range of several kilohertz. The input voltage 301 may be provided to the NMOS based ring oscillator 331 and the PMOS based ring oscillator 332. The NMOS based ring oscillator 331 may generate the output frequency 361 and the PMOS based ring oscillator 332 may generate the output frequency 362 in block 520. In block 530, the control unit may compare the output frequencies 361 and 362 with their respective threshold frequencies, and use the result of the comparison to set the appropriate control signal 342 to the multiplexer 341. If the output frequency 361 is higher than the threshold frequency of the NMOS based ring oscillator 331, the multiplexer 341 may provide the output frequency 361 to the counter 351 in block 531. Alternatively, if the output frequency 362 is higher than the threshold frequency of the PMOS based ring oscillator 332, the multiplexer 341 may provide the output frequency 362 to the counter 351 in block 532. The counter 351 may generate the digital symbol 371 based on the provided output frequency in block 540.

Figure 6:
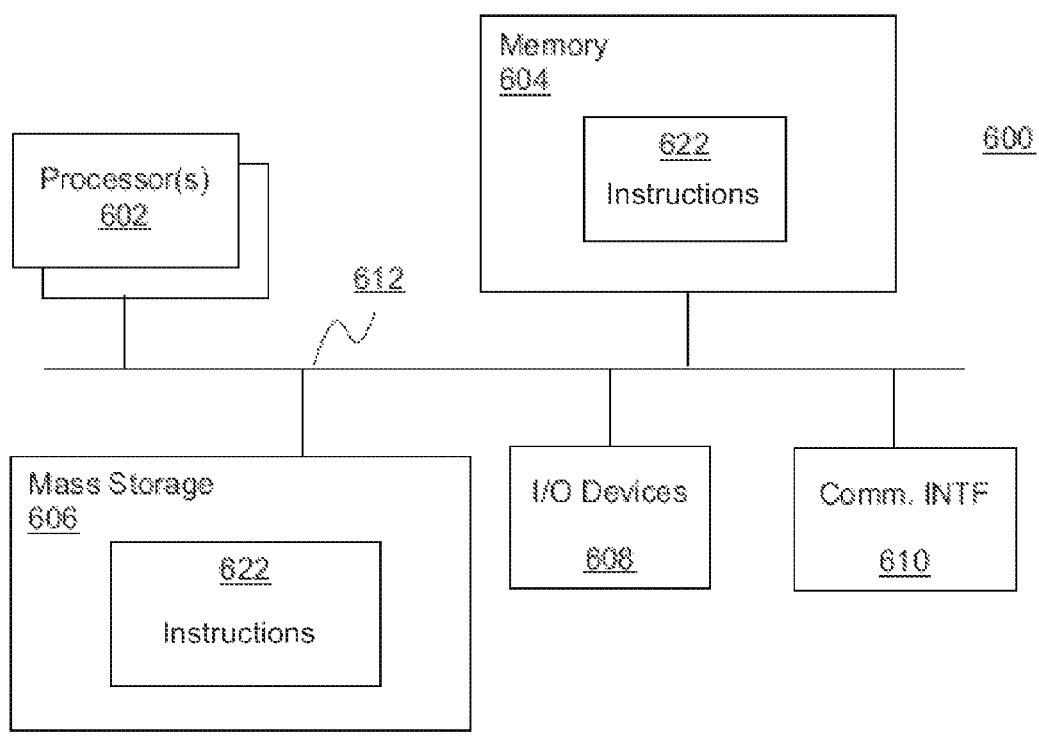
FIG. 6 illustrates an example computer system suitable for use to practice various embodiments of the present invention.

FIG. 6 illustrates an example computer system suitable for use to practice various embodiments of the present invention. As shown, computing system 600 may include a number of processors or processor cores 602, and system memory 604. For the purpose of this application, including the claims, the terms "processor" and "processor cores" may be considered synonymous, unless the context clearly requires otherwise. The processors 602 may contain one or more ADCs as previously illustrated.

Additionally, computing system 600 includes mass storage devices 606 (such as diskette, hard drive, compact disc read only memory (CDROM) and so forth), input/output devices 608 (such as keyboard, cursor control and so forth) and communication interfaces 610 (such as network interface cards, modems and so forth). The elements are coupled to each other via system bus 612, which represents one or more buses. In the case of multiple buses, they are bridged by one or more bus bridges (not shown).

Each of these elements performs its conventional functions known in the art. In particular, system memory 604 and mass storage 606 may be employed to store a working copy and a permanent copy of the programming instructions implementing one or more operating systems, drivers, applications, and so forth, herein collectively denoted as 622.

The permanent copy of the programming instructions may be placed into permanent storage 606 in the factory, or in the field, through, for example, a distribution medium (not shown), such as a compact disc (CD), or through communication interface 610 (from a distribution server (not shown)). That is, one or more distribution media having an implementation of the agent program may be employed to distribute the agent and program various computing devices.

The remaining constitution of these elements 602-612 are known, and accordingly will not be further described.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present invention. This application is intended to cover any adaptations or variations of the embodiments discussed herein. Therefore, it is manifestly intended that the embodiments of the present invention be limited only by the claims and the equivalents thereof.

What is claimed is:

1. An apparatus comprising:
   an input terminal configured to accept an input voltage;
   a ring oscillator to generate an output frequency based on the input voltage, the ring oscillator including a group of circuit cells coupled successively and circularly, wherein each one of the group of circuit cells includes pull-up transistor and a pull-down transistor, each pull-up transistor being configured to conduct more current than each pull-down transistor, wherein the input terminal is coupled to gate terminals of at least two pull-down transistors of the group of circuit cells to control the output frequency; and
   a counter to generate a symbol representing the input voltage based on the output frequency.

2. The apparatus of claim 1, wherein the input terminal is coupled to gate terminals of each pull-down transistor of the group of circuit cells to control the output frequency.

3. The apparatus of claim 2, wherein a drain terminal of the pull-up transistor and a drain terminal of the pull-down transistor of a last one of the group of circuit cells are jointly coupled to a gate terminal of the pull-up transistor of a first one of the group of circuit cells.

4. The apparatus of claim 2, wherein a drain terminal of the pull-up transistor and a drain terminal of the pull-down transistor of each one of the group of circuit cells are jointly coupled to a gate terminal of the pull-up transistor of an immediately succeeding circuit cell of the group of circuit cells and are jointly decoupled from the gate terminal of the pull-down transistor of the immediately succeeding circuit cell of the group of circuit cells.

5. The apparatus of claim 2, wherein the pull-up transistor is a P type transistor and the pull-down transistor is an N type transistor.

6. The apparatus of claim 2, wherein the ring oscillator is a first ring oscillator and the output frequency is a first output frequency, the apparatus further comprising:

a second ring oscillator to generate a second output frequency based on the input voltage, the second ring oscillator including a second group of circuit cells coupled to each other, wherein each one of the second group of circuit cells comprise a second pull-up transistor and a second pull-down transistor, wherein each second pull-down transistor is configured to conduct more current than each second pull-up transistor, wherein gate terminals of the second pull-up transistors of the second group of circuit cells are coupled to the input terminal.

7. The apparatus of claim 6, wherein a drain terminal of the second pull-up transistor and a drain terminal of the second pull-down transistor of each one of the second group of circuit cells are jointly coupled to a gate terminal of the pull-down transistor of an immediately succeeding circuit cell of the second group of circuit cells and are jointly decoupled from the gate terminals of the second pull-up transistors.

8. The apparatus of claim 6, further comprising:

a multiplexer coupled to the first ring oscillator and the second ring oscillator to selectively output either the first output frequency or the second output frequency to the counter.

9. The apparatus of claim 1, wherein the ring oscillator is configured to operate without an external start pulse being applied to the ring oscillator.

* * * * *